US008586430B2

(12) United States Patent
Komeda

(10) Patent No.: US 8,586,430 B2
(45) Date of Patent: Nov. 19, 2013

(54) METHOD OF FORMING DIELECTRIC FILM AND CAPACITOR MANUFACTURING METHOD USING THE SAME

(75) Inventor: Kenji Komeda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 1559 days.

(21) Appl. No.: 11/657,022

(22) Filed: Jan. 24, 2007

(65) Prior Publication Data

US 2007/0173028 A1    Jul. 26, 2007

(30) Foreign Application Priority Data

Jan. 25, 2006    (JP) .................................. 2006-016488

(51) Int. Cl.
*H01L 21/8242*    (2006.01)
(52) U.S. Cl.
USPC ............................... 438/240; 438/3; 438/287
(58) Field of Classification Search
USPC ....................................... 438/3, 240, 249, 238
See application file for complete search history.

(56) References Cited

U.S. PATENT DOCUMENTS

| 5,976,918 | A | 11/1999 | Matsuoka et al. |
| 6,946,409 | B2 | 9/2005 | Takimoto |
| 7,364,965 | B2 | 4/2008 | Tonomura et al. |
| 2004/0175586 | A1* | 9/2004 | Raaijmakers et al. ........ 428/469 |
| 2005/0023584 | A1* | 2/2005 | Derderian et al. ............ 257/296 |
| 2005/0260357 | A1 | 11/2005 | Olsen et al. |
| 2006/0166512 | A1* | 7/2006 | Lee et al. ........................ 438/785 |
| 2007/0161201 | A1* | 7/2007 | Yamamoto ...................... 438/396 |

FOREIGN PATENT DOCUMENTS

| JP | 7-321046 | 8/1995 |
| JP | 10-163197 | 6/1998 |
| JP | 2002-299268 | 10/2002 |
| JP | 2003-188171 | 4/2003 |
| JP | 2003-318284 | 7/2003 |
| JP | 2004-349381 | 12/2004 |
| JP | 2005-150416 | 6/2005 |
| JP | 2005-159271 | 6/2005 |
| JP | 2008-500741 | 1/2008 |
| WO | WO 2005/117086 | 12/2005 |

OTHER PUBLICATIONS

Japanese Office Action dated Dec. 6, 2010 with a partial English translation.

* cited by examiner

*Primary Examiner* — H. Jey Tsai
(74) *Attorney, Agent, or Firm* — McGinn IP Law Group, PLLC

(57) ABSTRACT

In a method of manufacturing a capacitor, a lower electrode of a capacitor is formed on or above a semiconductor substrate. An ozone gas and an inert gas are simultaneously introduced for a predetermined period into a reaction chamber of an atomic layer deposition apparatus in which the semiconductor substrate is set. Then, the ozone gas is exhausted from the reaction chamber by stopping the introduction of the ozone gas and introducing only the inert gas into the reaction chamber, after the introduction. A capacitive dielectric film is formed on the lower electrode by an atomic layer deposition (ALD) method in the atom layer deposition apparatus. An upper electrode of the capacitor is formed on the capacitive dielectric film after the capacitive dielectric film is formed.

19 Claims, 10 Drawing Sheets

Fig. 11

|  | 03 PREPROCESSING | |
|---|---|---|
|  | EXECUTED | NON-EXECUTED |
| DEVICE SCALE | 512M | 512M |
| $\beta$ [1/V] | 11.59 | 11.22 |
| Ea[e/V] | 0.72 | 0.69 |
| m | 2.189 | 2.150 |
| t50 [year] | 2.84E+06 | 3.13E+05 |
| t0.01 [year] | 4.10E+02 | 4.51E+01 |

METHOD OF FORMING DIELECTRIC FILM AND CAPACITOR MANUFACTURING METHOD USING THE SAME

BACKGROUND OF THE INVENTION

1. Field of the Invention

The present invention relates to a method of forming a dielectric film. More particularly, the present invention relates to a method of forming a dielectric film by using an atomic layer deposition (ALD) method and a method of manufacturing a capacitor having the dielectric film.

2. Description of the Related Art

With the advancement of a miniaturization technique, an integration density of DRAM has been increased year by year, and the area of one capacitor has been decreased. On the other hand, the capacitance of the capacitor needs to be kept, for the sake of a normal operation of a semiconductor memory device. Thus, with the advancement of a generation of DRAM, the structure having a high aspect ratio such as a cylindrical structure has been mainly used for the capacitor structure. In this case, a dielectric film (capacitive insulating film) of the capacitor needs to be formed on a lower electrode under the structure having the high aspect ratio. For this reason, as the method of forming the dielectric film, an ALD (Atomic Layer Deposition) method is used which is excellent in coverage to a conventional CVD (Chemical Vapor Deposition) method.

According to the ALD method, gaseous reactants are alternately supplied into a reaction chamber, and a film is sequentially formed in an atomic layer level. FIGS. 1A to 1E are diagrams showing a method of forming a dielectric film by using the ALD method. For example, an amorphous aluminum oxide film is formed as the dielectric film. TMA (Tri-Methyl Aluminum) is used as a first material gas including aluminum as the material of the aluminum oxide film, for example. Also, $O_3$ (ozone) gas is used as a second material gas (oxidization gas) necessary for oxidization reaction.

At first, as shown in FIG. 1A, a TMA gas 2 as the material gas is introduced into the reaction chamber. Thus, the TMA gas 2 is chemically adsorbed on the surface of a lower layer 1. The TMA gas 2 that is not adsorbed is exhausted from the reaction chamber through a purging operation by using inert gas such as argon (Ar) gas or an evacuating operation. As a result, as shown in FIG. 1B, a TMA film 3 is formed on the surface of the lower layer 1. Next, as shown in FIG. 1C, an ozone gas 4 as an oxidization gas from which oxygen radicals can be generated is introduced into the chamber. Since the ozone gas 4 chemically reacts with the TMA film 3 to form an aluminum oxide. Substances such as hydrogen and carbon that are included in the TMA 2 and are not absorbed on the lower layer 1, are exhausted from the reaction chamber. As a result, as shown in FIG. 1D, an aluminum oxide film 5 is formed on the surface of the lower layer 1. This aluminum oxide film 5 is an atomic layer having a film thickness of a substantial atomic size of a desirable substance.

Hereafter, since the TMA gas 2 and the ozone gas 4 are alternately supplied and the similar steps re repeated, the aluminum oxide films 5 are sequentially laminated. As a result, as shown in FIG. 1E, a dielectric film 6 having a desirable film thickness is formed on the lower layer 1. In this way, according to the ALD method, a thin film is formed by increasing the atomic layer one by one. As a result, even in case of the high aspect structure, it is possible to grow the thin film that is fine and excellent in quality.

However, in case of the ALD method, the quality of the film formed at an initial stage is greatly influenced by the state of the surface of the lower layer 1. For example, if an organic material is deposited on the surface of the lower layer 1 or if a natural oxide film is locally grown, the surface of the lower layer 1 becomes ununiform. In that case, the film low in density and including many impurities so that the quality is poor is formed at the initial stage of the dielectric film formation. This leads to deterioration in characteristics of a semiconductor device using the formed dielectric film. Also, it is known that in the boundary of the formed dielectric film, any defect of a crystal structure caused due to dangling bonds is generated, which leads to the deterioration in characteristics of the semiconductor device.

For example, in case of the DRAM, when the dielectric film (capacitive insulating film) of the capacitor has a defect, or if its film quality is poor, leakage current from the capacitor increases. The increase in leakage current results in the deterioration in data holding characteristic of the DRAM, and a frequently refreshing operation leads to the increase in power consumption. Thus, in order to prevent the deterioration in DRAM characteristics, the dangling bond, the organic material deposited on the lower electrode surface, and the natural oxide film need to be sufficiently removed. In particular, in order to improve the characteristics of the high integration DRAM, a technique is demanded that can provide the capacitive insulating film less in defect and excellent in quality by the ALD method.

In conjunction with the above description, a method of manufacturing a capacitor that has a double dielectric film structure is described in Japanese Laid Open Patent Application (JP-P2003-318284A). In this conventional manufacturing method, a lower electrode is formed on a semiconductor substrate, a double dielectric film composed of an $Al_2O_3$ film and a $Ta_2O_5$ film is formed on the lower electrode, and an upper electrode is formed on the double dielectric film. Prior to the evaporation of the $Al_2O_3$ film, a low temperature heating process is temporally carried out in $NO_2$ or $O_2$ ambience by using in-situ plasma for selective oxidization.

Also, a method of forming a thin film is disclosed in Japanese Laid Open Patent Application (JP-A-Heisei, 7-321046). In this conventional method, an ultraviolet lamp for cleaning a wafer and an infrared lamp for heating are provided in a film forming chamber in an LPCVD apparatus. After a sample substrate is fed into the film forming chamber, firstly, an $O_3$ gas is introduced while ultraviolet rays are irradiated by the ultraviolet lamp. Thus, the organic material on the wafer surface is removed. In succession, a mixture gas of H2 and F2 is introduced while the ultraviolet rays are irradiated. Therefore, a natural silicon oxide film is removed. After that, the irradiation of the ultraviolet rays is stopped, and the output of the infrared lamp is increased. After a substrate temperature is increased, the thin film is formed by an LPCVD method.

According to the techniques disclosed in the above conventional examples, a special mechanism needs to be provided in the film forming apparatus. Thus, there is no general purpose.

Also, a method of forming a high dielectric film that is used as a gate insulating film of a MOS transistor is disclosed in Japanese Laid Open Patent Application (JP-P2003-188171A). In this conventional method, a silicon substrate is oxidized through an oxidative gas containing ozone, and a first reactive material is adsorbed on the oxidization surface of the substrate. Then, a second reactive material is introduced to react with the residue of the first reactive material on the oxidization surface. At the first step, the ozone gas ($O_3$) of a high concentration that is diluted with oxygen gas ($O_2$) is introduced into a reacting chamber. The concentration of the ozone gas diluted with the oxygen gas is, for example, 70%.

In this first step, a relatively thick oxide film of the film thickness of 0.1 to 1 nm is formed on the substrate surface. However, if such a thick capacitive oxide film is formed in manufacturing a capacitor, the capacitance of the capacitor is greatly reduced.

SUMMARY OF THE INVENTION

An object of the present invention is to provide a technique for uniformly forming by an ALD method, a dielectric film which is excellent in quality, while suppressing increase in the film thickness.

Another object of the present invention is to provide a technique for improving the film quality of a dielectric film without any special facility other than a typical atomic layer deposition apparatus.

Still another object of the present invention is to provide a technique for reducing leakage current while suppressing reduction of a capacitance in a capacitor of a semiconductor device.

Still another object of the present invention is to provide a technique for improving the life of a dielectric film in a capacitor of a semiconductor device.

Still another object of the present invention is to provide a technique for decreasing a manufacture cost of a capacitor in a semiconductor device.

Still another object of the present invention is to provide a technique for improving a data holding characteristic and reliability of a DRAM.

In an aspect of the present invention, a method of manufacturing a capacitor is achieved by (a) forming a lower electrode of a capacitor on or above a semiconductor substrate; by (b) introducing an ozone gas and an inert gas simultaneously for a predetermined period into a reaction chamber of an atomic layer deposition apparatus in which the semiconductor substrate is set; by (c) exhausting the ozone gas from the reaction chamber by stopping the introduction of the ozone gas and introducing only the inert gas into the reaction chamber, after the (b) introducing; by (d) forming a capacitive dielectric film on the lower electrode by an atomic layer deposition (ALD) method in the atom layer deposition apparatus, after the (c) exhausting; and by (e) forming an upper electrode of the capacitor on the capacitive dielectric film after the capacitive dielectric film is formed.

Here, the (c) exhausting may be achieved by (c1) stopping the introduction of the ozone gas and the inert gas; by (c2) exhausting the reaction chamber to a vacuum state after the (c1) stopping; and by (c3) introducing only the inert gas into the reaction chamber, after the (c2) exhausting.

Also, the (c) exhausting may be achieved by repeating the (c2) exhausting and the (c3) introducing.

Also, the predetermined period in the (b) introducing may be a period in a range from one second or more to 120 seconds or less.

Also, the predetermined period in the (b) introducing may be a period in a range from 40 seconds or more to 120 seconds or less.

Also, it is preferable that a process temperature in each of the (b) introducing and the (c) exhausting is substantially same as that of the (d) forming.

Also, the method may be achieved by further forming an oxidization preventing film on the lower electrode after the (a) forming and before the (b) introducing.

Also, the (d) forming may be achieved by (d1) introducing a material gas which contains the material of the capacitive insulating film into the reaction chamber; by (d2) introducing the inert gas in the reaction chamber to purge the material gas; and by (d3) introducing an oxidation gas necessary for oxidation reaction into the reaction chamber. The inert gas used in the (d2) introducing is same as that of each of the (b) introducing and the (c) exhausting.

Also, the oxidation gas used in the (d3) introducing may be an ozone gas.

Also, the capacitive dielectric film may contain at least one of an amorphous aluminum oxide film, an amorphous hafnium oxide film and an amorphous zirconium oxide film.

In another aspect of the present invention, a method of manufacturing a DRAM, is achieved by forming a transistor on or above a semiconductor substrate; and by forming a capacitor connected with the transistor.

In still another aspect of the present invention, a method of forming a dielectric film, is achieved by setting a semiconductor substrate, on which a lower layer structure has been formed, in a reaction chamber of an atomic layer deposition apparatus; by introducing an ozone gas and an inert gas simultaneously into the reaction chamber for a predetermined period; by exhausting the ozone gas from the reaction chamber by stopping the introduction of the ozone gas and introducing only the inert gas into the reaction chamber; and by forming a dielectric film on the lower layer structure by an atomic layer deposition (ALD) method in the atom layer deposition apparatus.

According to the present invention, the formation of the uniform and defectless dielectric film can be formed by the ALD method. Also, the increase in the film thickness of the formed dielectric film is suppressed. Thus, in the capacitor having the dielectric film, the capacitance reduction is suppressed, and the leakage current is decreased. That is, both of the keeping of the capacitance and the reduction in the leakage current are attained. Moreover, in the DRAM that uses a capacitor for a memory cell, the data holding characteristic and the reliability are improved. Also, since a refreshing operation is suppressed, the power consumption of the DRAM is decreased.

Also, according to the present invention, in order to form the uniform dielectric film that is excellent in quality, any special facility other than the typical atomic layer deposition apparatus is not required. The same atomic layer deposition apparatus can be used to continuously perform a pre-process and the ALD film formation. Thus, the manufacture cost of the capacitor of the semiconductor device can be decreased.

BRIEF DESCRIPTION OF THE DRAWINGS

FIG. 11 is a table view showing a comparison of the estimation life of the capacitive insulating film;

DESCRIPTION OF THE PREFERRED EMBODIMENTS

Hereinafter, a method of forming a dielectric film and a method of manufacturing a capacitor according to the present invention will be described in detail with reference to the attached drawings. The capacitor manufactured in the present invention is used as a memory cell of DRAM.

[First Embodiment]

Figure 1A:
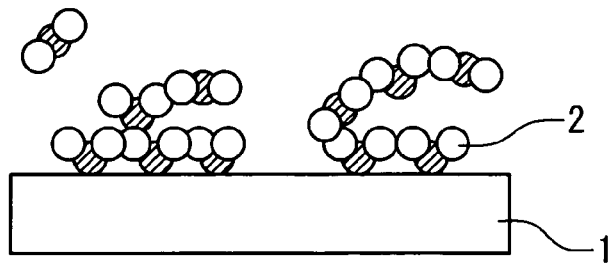
FIGS. 1A to 1E are diagrams showing conventional steps of forming a dielectric film in a manufacturing process using an ALD method.
Figure 1B:
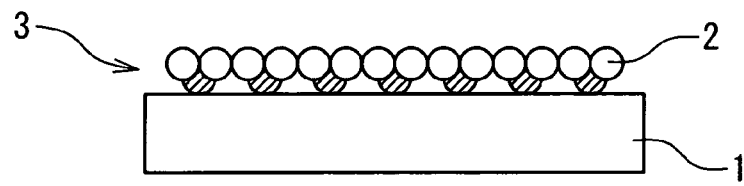
Figure 1C:
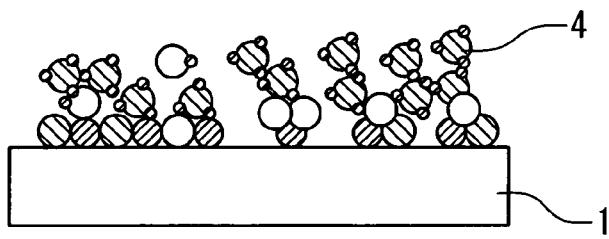
Figure 1D:
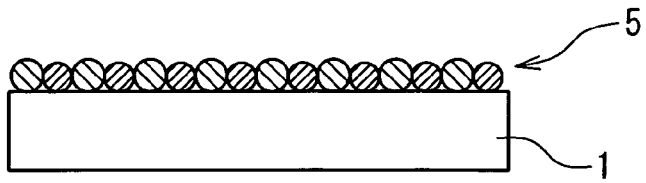
Figure 1E:
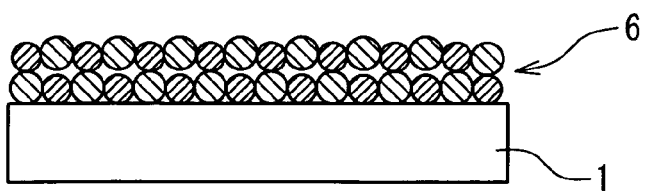
Figure 2:
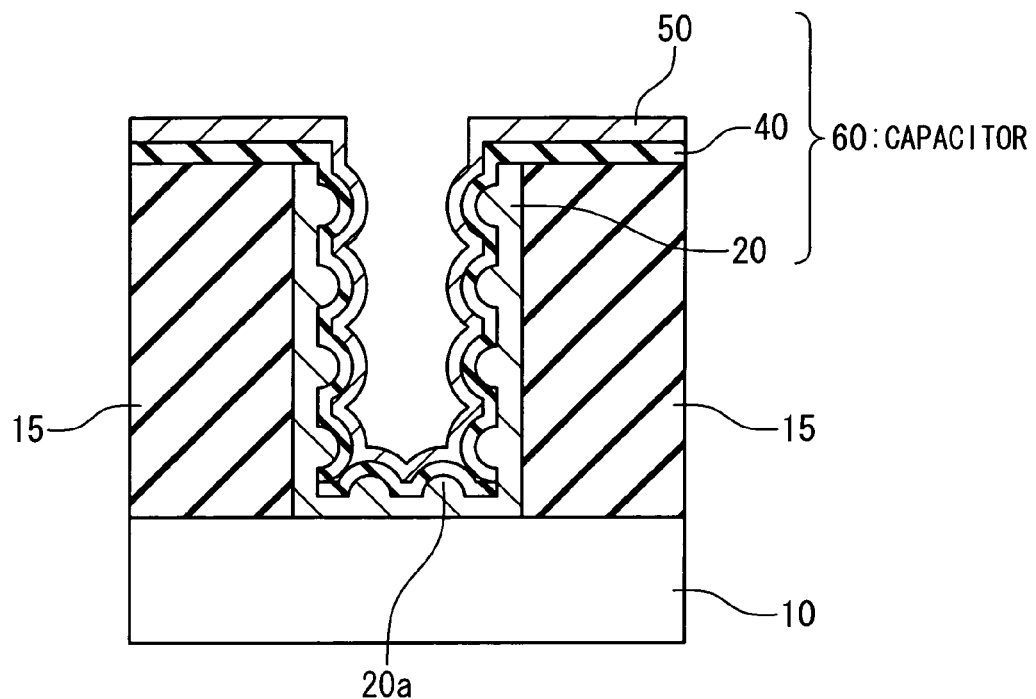
FIG. 2 is a sectional view showing a structure of a capacitor according to an embodiment of the present invention.

FIG. 2 is a cross sectional view showing the structure of a capacitor 60 of the DRAM manufactured in this embodiment. In FIG. 2, the capacitor 60 has the structure of a cylinder type. Specifically, an inter-layer insulating film 15 is formed on or above a semiconductor substrate 10, and the capacitor 60 is formed in a cylinder portion formed at a predetermined position of the inter-layer insulating film 15. The capacitor 60 has a lower electrode 20, a dielectric film (capacitive insulating film) 40 and an upper electrode 50. The lower electrode 20 is formed on or above the surface of the semiconductor substrate 10 and on the inner surface of the cylinder portion formed in the inter-layer insulating film 15. The capacitive insulating film 40 is formed to be put between the lower electrode 20 and the upper electrode 50. Since an aspect ratio of the cylinder portion is high, the capacitive insulating film 40 is formed by using the ALD method. The upper electrode 50 is formed on the capacitive insulating film 40.

Figure 3:
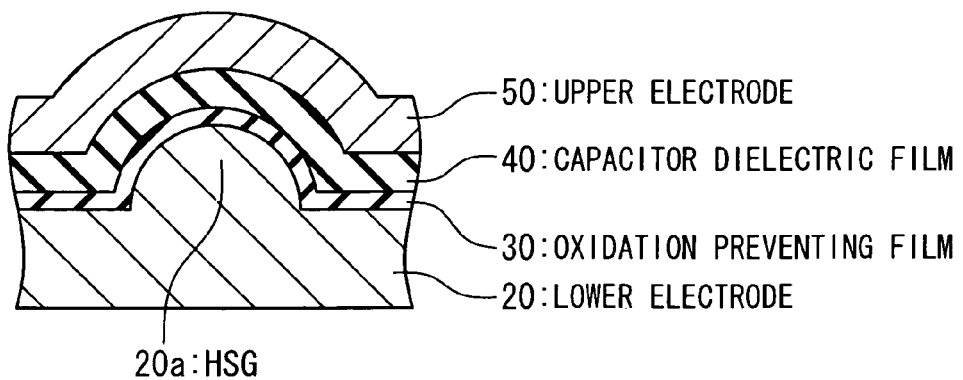
FIG. 3 is an enlarged sectional view showing a part of the structure shown in FIG. 2.

FIG. 3 is an enlarged sectional view showing a part of the capacitor 60 shown in FIG. 2. As the lower electrode 20, a silicon-based conductive film is exemplified such as a polysilicon film in which impurity is doped. Also, a hemispherical grain (HSG) silicon 20a made of polysilicon and having the shape of a hemi-sphere is formed on the surface portion of the lower electrode 20. This HSG 20a is provided in order to increase the surface area of the lower electrode 20 and increase the capacitance value of the capacitor 60.

An oxidization prevention film 30 is formed on the lower electrode 20. This oxidization prevention film 30 functions to prevent a natural oxide film from being grown on the surface of the lower electrode 20. Also, this oxidization prevention film 30 functions to prevent the surface of the lower electrode 20 from being oxidized when the capacitive insulating film 40 is formed. In short, this oxidization prevention film 30 suppresses the reduction in the capacitance of the capacitor 60. As the oxidization prevention film 30, a silicon nitride film and a silicon oxide film are exemplified. This oxidization prevention film 30 is formed by performing annealing by a rapid thermal processing (RTP) for about 60 seconds under ammonium atmosphere and performing a nitriding process on the surface of the lower electrode 20.

The capacitive insulating film 40 is formed on the oxidization prevention film 30. Since the aspect ratio is high, this capacitive insulating film 40 is deposited by using the ALD method. As the capacitive insulating film 40, an amorphous aluminum film is exemplified.

The upper electrode 50 is formed on the capacitive insulating film 40. As the upper electrode 50, a TiN film is exemplified. The TiN film is evaporated by using the CVD method.

Figure 4:
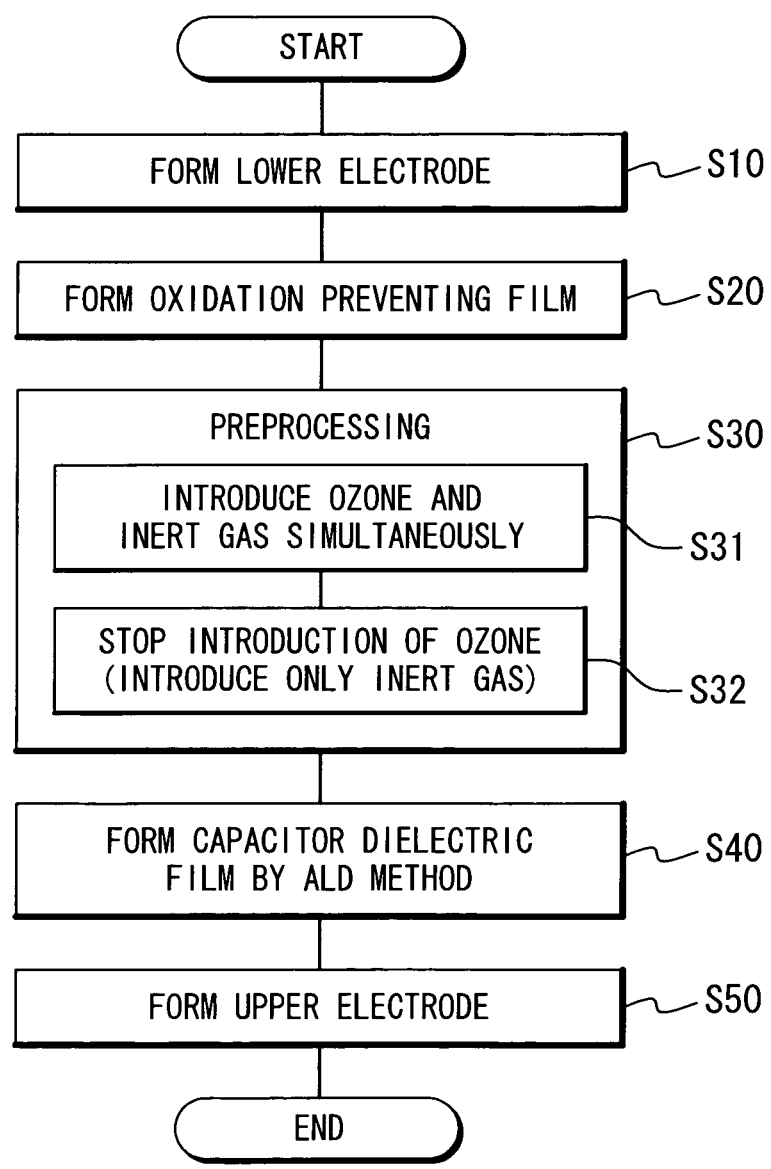
FIG. 4 is a flowchart showing a method of manufacturing a capacitor according to the first embodiment.

Next, the method of manufacturing the capacitor 60 according to this embodiment will be described below with reference to a flowchart shown in FIG. 4.

At first, the inter-layer insulating film 15 is formed on or above the semiconductor substrate (silicon substrate) 10. Then, the cylinder portion is formed at a predetermined position of the inter-layer insulating film 15. Subsequently, by using the CVD method, the polysilicon is evaporated, and the lower electrode 20 is formed on the inner surface of the cylinder portion (Step S10). Moreover, a plurality of HSGs 20a are formed on the surface portion of the lower electrode 20. Subsequently, RTP is used to carry out the annealing for about 60 seconds under the ammonia atmosphere, and the nitriding process is performed on the surface of the lower electrode 20. As a result, the silicon nitride film serving as the oxidization prevention film 30 is formed on the surface of the lower electrode 20 (Step S20).

Next, in order to deposit the dielectric film by using the ALD method, the semiconductor substrate 10 as a process target is conveyed into the atomic layer evaporation apparatus. In the atomic layer evaporation apparatus, firstly, a pre-process is carried out (Step S30). After that, a film forming process is carried out in accordance with the ALD method, to form the dielectric film on the lower layer (Step S40). In this embodiment, the lower layer is the oxidization prevention film 30, and the capacitive insulating film (dielectric film) 40 is formed through the oxidization prevention film 30 on the lower electrode 20. After the capacitive insulating film 40 is formed, the semiconductor substrate 10 as the process target is conveyed out from the atomic layer evaporation apparatus. Those processes (steps S30, S40) in the atomic layer evaporation apparatus will be described later in detail. Next, by using the CVD method, the TiN film serving as the upper electrode 50 is formed on the capacitive insulating film 40 (Step S50). In this way, the capacitor 60 is formed on or above the semiconductor substrate 10.

In case of manufacturing the DRAM, in addition to the step of forming the capacitor 60 as mentioned above, a step is performed to form the MOS transistor, which is connected to the capacitor 60, on the semiconductor substrate 10.

As mentioned above, the steps S30 and S40 are carried out in the atomic layer evaporation apparatus. In the course for feeding the substrate as the process target into the atomic layer evaporation apparatus, there is a possibility that the organic material is deposited on the surface of the lower layer on which the capacitive insulating film 40 is deposited or that a natural oxide film is locally grown. Those organic material and natural oxide film on the lower surface deteriorate the film quality of the capacitive insulating film 40 formed by using the ALD method. According to the present invention, a process for preventing the deterioration in the film quality is carried out in the atomic layer evaporation apparatus. The steps S30 and S40 in the present invention will be described below in detail. It should be noted that in the following description, it is supposed that the amorous aluminum oxide film is formed as the capacitive insulating film 40., it is supposed that the ALD method uses TMA (Tri-Methyl Aluminum) as the material gas and uses O3 (ozone) as the oxidization gas (oxidizer). Also Also, as the inert gas necessary for the purging and the like, it is supposed that Ar (argon) is used.

(Atomic Layer Evaporation Apparatus)

Figure 5:
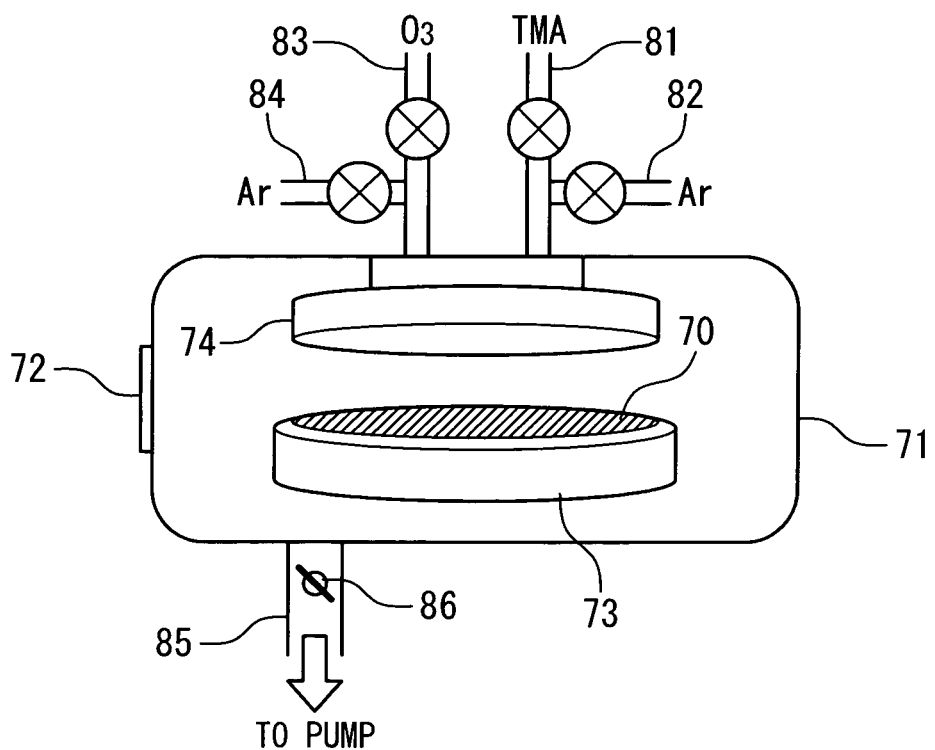
FIG. 5 is a schematic view showing a configuration of an atomic layer evaporation apparatus.

At first, the outline of the atomic layer evaporation apparatus will be described below with reference to FIG. 5. In this embodiment, when the capacitive insulating film 40 is formed, a leaf type atomic layer evaporation apparatus (single wafer ALD system) is used. The atomic layer evaporation apparatus shown in FIG. 5 contains a reaction chamber 71 where the film forming process is performed on a semiconductor substrate 70. The semiconductor substrate 70 as the process target is conveyed through a feeding port 72 into the reaction chamber 71 and placed on a stage heater 73 in the reaction chamber 71. The stage heater 73 can heat the semiconductor substrate 70 to a proper film formation temperature. The film formation temperature is selected from a range between 250 and 500° C., on the basis of the kind of the formed dielectric film and the like. For example, the film formation temperature is set to 400° C.

Also, the gases necessary for the process (material gas, oxidization gas and inert gas) are introduced through a shower head 74 into the reaction chamber 71. Specifically, the atomic layer evaporation apparatus contains a TMA introduction pipe 81 linked to the shower head 74, a TMA line Ar introduction pipe 82, an ozone introduction pipe 83 and an ozone line Ar introduction pipe 84. The TMA and the ozone are introduced from the TMA introduction pipe 81 and the ozone introduction pipe 83 into the reaction chamber 71, independently of each other. The argon serving as the inert gas is introduced from at least one of the TMA line Ar introduction pipe 82 and the ozone line Ar introduction pipe 84 into the reaction chamber 71. In such a way that the inside of each of the TMA introduction pipe 81 and the ozone introduction pipe 83 can be replaced with the argon, the Ar introduction pipes 82 and 84 are connected to each of the TMA introduction pipe 81 and the ozone introduction pipe 83.

More over, in order to exhaust non-reaction gas and reaction products, an exhaust pipe 85 is arranged for the atomic layer evaporation apparatus. This exhaust pipe 85 is connected to a vacuum exhaust facility (not shown). Also, a pressure control rotation valve 86 is placed inside the exhaust pipe 85. By adjusting the open/close degree of the pressure control rotation valve 86, the pressure inside the reaction chamber 71 can be adjusted in a range between 0.133 and 13.3 Pa. For example, the pressure is adjusted so as to be about 1.33 Pa.

After the semiconductor substrate 70 in which the lower layer structure has been formed is conveyed into the reaction chamber 71, a pre-heating process is carried out in order to stabilize a substrate temperature. Specifically, the semiconductor substrate 70 is held on the stage heater 73 for 60 seconds. During the pre-heating process, the argon is introduced through the Ar introduction pipes 82 and 84 into the reaction chamber 71. According to this embodiment, [Ozone Pre-process] is performed between this pre-heating process and a depositing process of the aluminum oxide film by using the ALD method (FIG. 4: Step S30).

Figure 6:
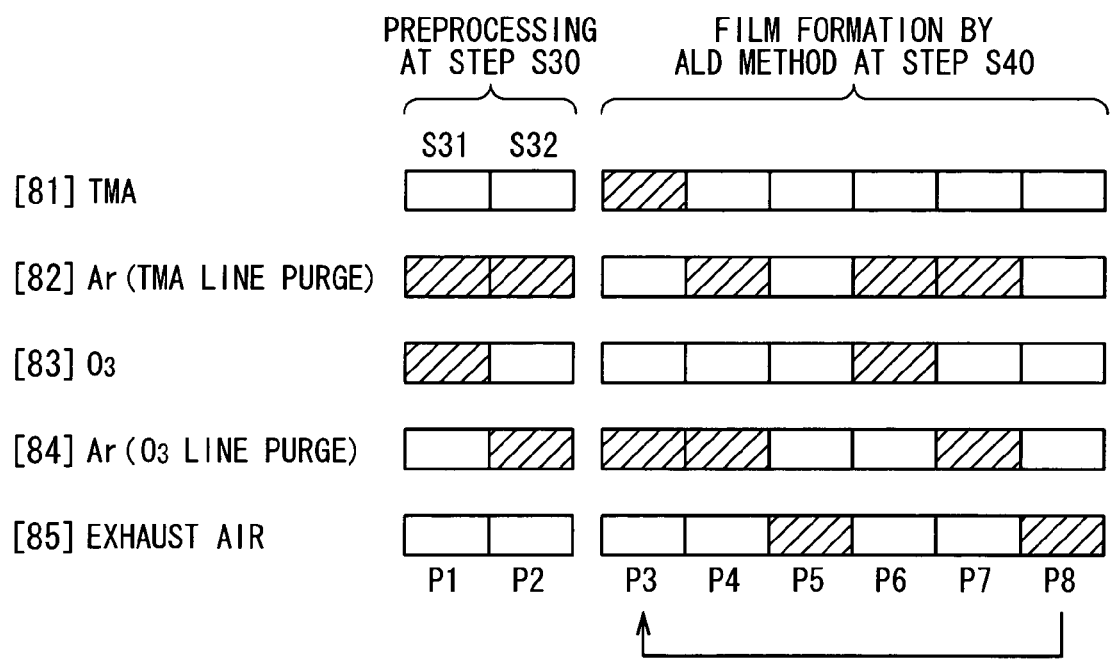
FIG. 6 is a timing view showing a method of forming a dielectric film according to the first embodiment.

[Ozone Pre-heating (Step S30)] and [ALD Process (Step S40)] according to this embodiment will be described below in detail with reference to FIGS. 4 and 6. FIG. 6 is a timing chart showing an ON/OFF state of each of the lines (81 to 85) shown in FIG. 5. Step S31:

At first, the ozone and the argon as the inert gas are simultaneously introduced into the reaction chamber 71 for a predetermined period P1. Specifically, as shown in FIG. 6, the ozone is supplied through the ozone introduction pipe 83, and the argon is supplied through the TMA line Ar introduction pipe 82. As a result, the inside of the reaction chamber 71 is replaced with a mixture atmosphere of the ozone and the argon. Since the semiconductor substrate 70 provided in the reaction chamber 71 is exposed to the mixture atmosphere, the organic materials on the surface of the lower layer structure are removed. Also, since only the surface of the lower layer structure is oxidized, the non-uniformity of the surface states caused by the natural oxide film that is locally grown on the surface of the lower layer structure is improved, and the surface is uniformly terminated with oxygen atoms.
Step S32:

Next, the supply of the ozone through an ozone introduction pipe 38 is stopped. As shown in FIG. 6, the argon may be supplied through both of the TMA line Ar introduction pipe 82 and the ozone line Ar introduction pipe 84 into the reaction chamber 71. The step S32 is continued for a predetermined period P2. As the result of this step S32, the ozone is perfectly exhausted from the reaction chamber 71.

It should be noted that the substrate temperature of the ozone pre-heating is desired to be set to the same temperature as the ALD method, from the viewpoint of the processing performance. Also, in this example, the substrate temperature of the ozone pre-heating is set to 400° C. that is equal to the temperature of the ALD method. Also, the pressure inside the reaction chamber 71 is controlled to be about 1.33 Pa.
Step S40:

After the completion of the ozone pre-heating, the capacitive insulating film (amorous aluminum oxide film) 40 is formed on the lower layer structure by the ALD method (refer to FIGS. 1A to 1E). The film formation temperature is set to 400° C. that is equal to the set temperature of the ozone pre-heating. As shown in FIG. 6, the TMA serving as the material gas is firstly introduced through the TMA introduction pipe 81 into the reaction chamber 71. Subsequently, the argon is introduced through the Ar introduction pipes 82 and 84, and the purging is carried out. Subsequently, the vacuum exhaustion is carried out by using the vacuum exhaust facility. Then, the ozone serving as the oxidization gas is introduced through the ozone introduction pipe 83 into the reaction chamber 71. After that, similarly, the purging argon is introduced, and the vacuum exhaustion is carried out. After that, the introduction of the TMA and the introduction of the ozone are alternately repeated, and amorphous aluminum oxide is deposited to a desired film thickness (for example, 4.0 nm).

As mentioned above, through the ozone pre-heating, the organic materials are already removed from the surface of the lower layer structure. Also, the surface of the lower layer structure is uniformly terminated with the oxygen atoms. As a result, at the step S40, the capacitive insulating film 40 is formed uniformly and finely. Also, the generation of the defect on the boundary between the lower layer structure and the capacitive insulating film 40 is prevented. In this way, the ozone pre-heating permits the capacitive insulating film 40 to be formed uniformly, which is small in defect and excellent in quality, at the step S40. Thus, the leakage current in the capacitor 60 including the capacitive insulating film 40 is decreased.

Also, attention should be paid to the fact that the gases used in the pre-process (Step S30) are the ozone and the argon and they are same as the gases used in the ALD step (Step S40). Those ozone and argon can be supplied through the ozone introduction pipe 83 and the Ar introduction pipes 82 and 84 in the usual atomic layer evaporation apparatus shown in FIG. 5. That is, the pre-process can be attained without adding any special mechanism to the atomic layer evaporation apparatus that is typically used in the ALD step. In other words, the same atomic layer evaporation apparatus can be used to continuously perform the pre-process and the ALD film formation. Thus, the manufacture cost of the capacitor 60 in the semiconductor device can be decreased.

Figure 7:
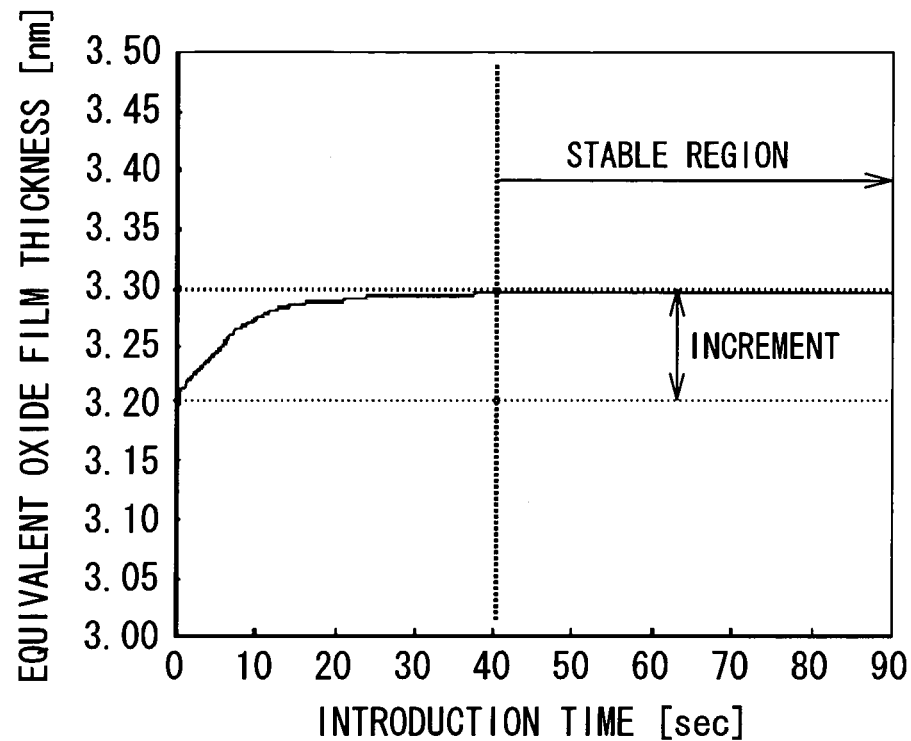
FIG. 7 is a graph showing a dependence on a time when an ozone pre-process of a film thickness of a capacitive insulating film is executed.

Moreover, at the step S31, simultaneously with the ozone, the argon serving as the inert gas is introduced into the reaction chamber 71. The introduction of the argon suppresses the oxidization reaction in the pre-process. The fact that the oxidization reaction is suppressed is described with reference to FIG. 7. FIG. 7 is a graph showing the relation between the film thickness of the formed capacitive insulating film (amorous aluminum oxide film) 40 and the period (P1) during which the step S31 is performed. The vertical axis indicates the value after the film thickness is converted into [Equivalent Oxide Film Thickness]. The horizontal axis indicates the period of the step S31 (the introduction time of the mixture gas of the ozone and the argon). In this example, an ozone concentration is 9 volume % ($O_2$ dilution), and its flow amount is 500 cc. Also, the flow amount of the simultaneously introduced argon (Ar) is also 500 cc.

Through the performance of the pre-process, namely, the performance of the step S31 for one second or more, the film thickness of the finally obtained capacitive insulating film 40 is gradually increased. This indicates that the effect of the pre-process appears. Also, if the period of the step S31 exceeds 40 seconds, the film thickness of the capacitive insulating film 40 is no longer increased and the film thickness increase is saturated. The difference between the film thickness after the saturation and the film thickness when the pre-process is not executed is 0.1 nm at most in the conversion into the oxide film. In short, the increase amount of the capacitive insulating film 40 resulting from the pre-process can be suppressed to 0.1 nm or less in the conversion into the oxide film. Even if the process time is increased, the increase width is not increased to that value or more. In this way, even if the pre-process according to the present invention is performed, the film thickness of the capacitive insulating film 40 is not uselessly increased. Thus, the reduction in the capacitance of the capacitor 60 is suppressed to a minimum.

In view of the foregoing discussion, in order to obtain the effect according to the present invention, the period of the step S31 is set to one second or more. However, if the period is less than 40 seconds, the increase amount of the film thickness of the capacitive insulating film 40 is unstable. Thus, in order to obtain the stable effect, the period of the step S31 is preferably set to 40 seconds or more. Also, from the viewpoint of the process performance, in order to improve the film forming method of the capacitive insulating film and obtain the characteristic similar to the application of the ozone pre-process, the process time per wafer needs to be set to be longer by about 120 seconds. This fact causes the period of the step S31 to be limited to 120 seconds or less. For example, the introduction time of the mixture gas of the ozone and the argon is set to 60 seconds.

Hereinafter, the comparison result of the characteristics will be described between the sample (DRAM) produced by the method according to the present invention and the characteristic of the sample produced by the conventional method in which the pre-process is not performed.

Figure 8:
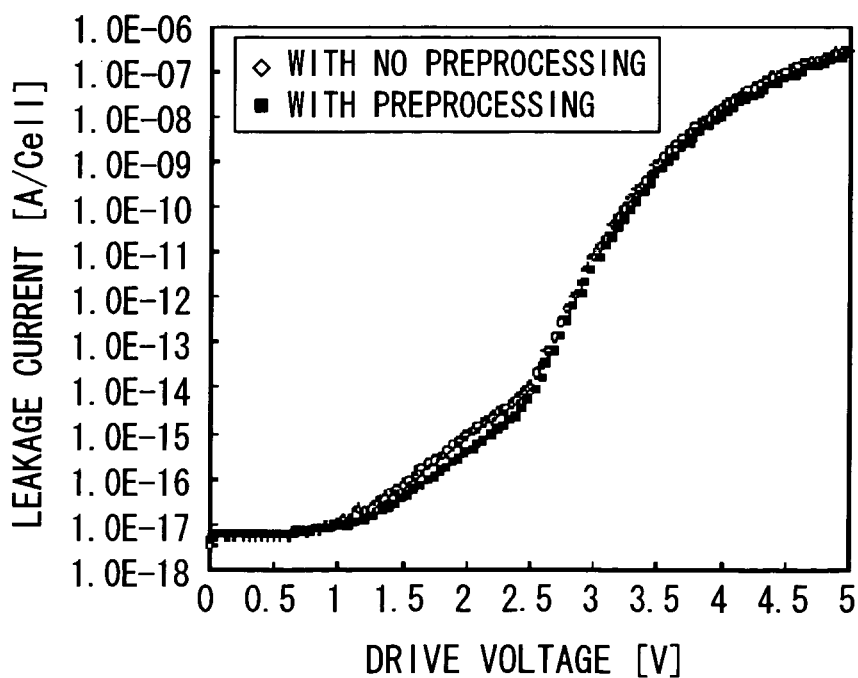
FIG. 8 is a graph showing a leakage current characteristic of a capacitor.

FIG. 8 shows the comparison in the leakage current characteristic. The vertical axis represents the leakage current per cell, and the horizontal axis represents a drive voltage. From FIG. 8, it would be understood that the leakage current is decreased by performing the pre-process. That is, according to the present invention, the leakage current characteristic is improved.

Figure 9:
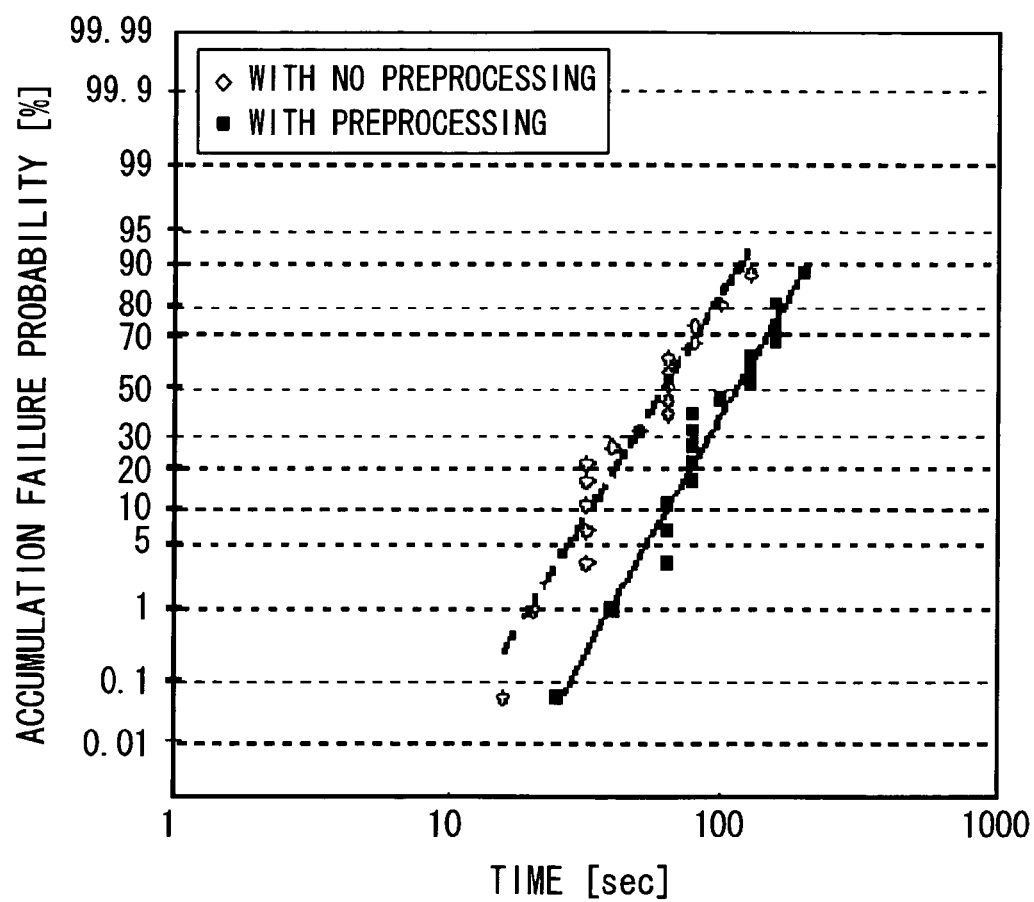
FIG. 9 is a graph showing a result of a constant voltage stress measurement.

FIG. 9 shows the result of a constant voltage stress measurement. The vertical axis represents an accumulation failure probability, and the horizontal axis represents a time during which a stress is applied. From FIG. 9, it could be understood that the accumulation failure probability is reduced by performing the pre-process.

Figure 10:
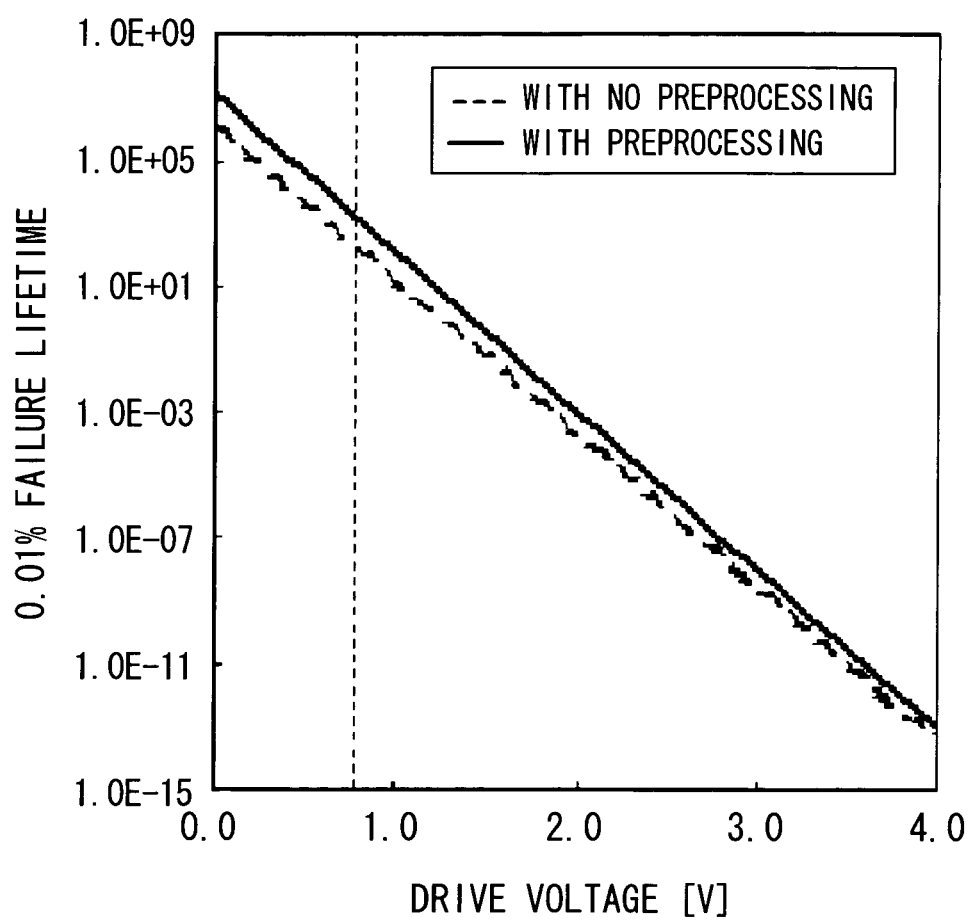
FIG. 10 is a graph showing an estimation life of the capacitive insulating film calculated from the constant voltage stress measurement result.

FIG. 10 shows predicted lifetime of the capacitive insulating film calculated from the constant voltage stress measurement result. The vertical axis represents 0.01% failure lifetime and the horizontal axis represents drive voltage. From FIG. 10, it could be understood that the lifetime of the capacitive insulating film is elongated by performing the pre-process.

FIG. 11 is a table indicating the comparison result of the predicted lifetime of the capacitive insulating film. In FIG. 11, β denotes an electric field acceleration coefficient, Ea denotes a temperature acceleration coefficient, and m denotes a shape parameter calculated from the graphs in FIG. 9. Symbols t50 and t0.01 indicate the predicted lifetime of the capacitive insulating film when the respective failure percentages are 50% and 0.01%. The conversion is performed under the condition of the device scale of 512 megabits. From FIG. 11, through application of the pre-process, the lifetime of the capacitive insulating film can be elongated by one digit.

As explained above, according to this embodiment, the leakage current characteristic of the capacitor is improved, and the lifetime of the capacitive insulating film is elongated by one digit. Thus, the data holding characteristic and reliability of the DRAM are improved. Also, according to this embodiment, the capacitance reduction in the capacitor is suppressed to the minimum. In this way, both of the reduction in the leakage current and the keeping of the capacitor capacitance are attained. Moreover, the special facility is not required in order to form the capacitive insulating film having the excellent quality. Thus, the manufacturing cost is decreased.

[Second Embodiment]

Figure 12:
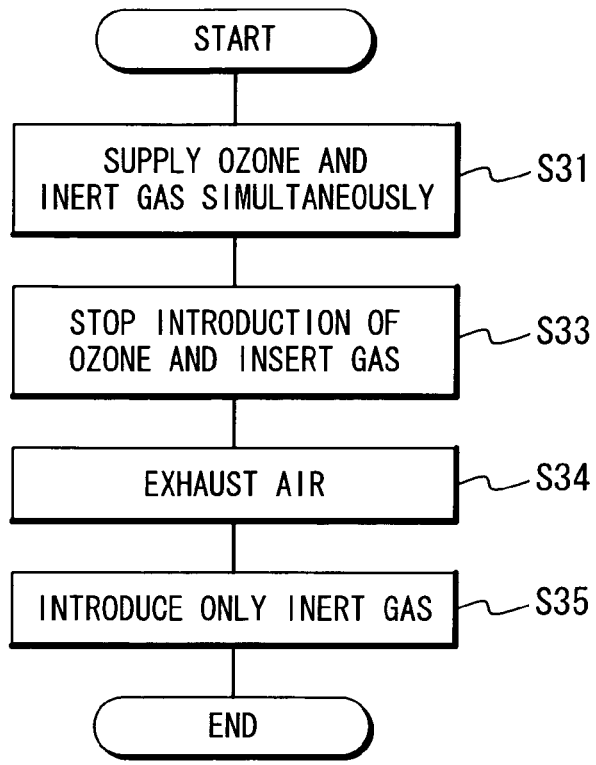
FIG. 12 is a flowchart showing a method of forming a dielectric film according to a second embodiment.

FIG. 12 is a flowchart showing an ozone pre-process (Step S30) according to the second embodiment of the present invention. At first, similarly to the first embodiment, the ozone and the argon serving as the inert gas are introduced into the reaction chamber 71 at the same time in a predetermined period (Step S31). As a result, the inside of the reaction chamber 71 is replaced with the mixture atmosphere of the ozone and the argon. Subsequently, the introductions of both of the ozone and the argon are stopped (Step S33), and the vacuum exhaustion is executed for a predetermined time (Step S34). Thus, the inside of the reaction chamber 71 becomes in a (semi) vacuum state. Thereafter, only the argon is introduced into the reaction chamber 71 (Step S35). The argon may be introduced through both of the TMA line Ar introduction pipe 82 and the ozone line Ar introduction pipe 84. Consequently, the inside of the reaction chamber 71 is replaced with the argon, and the ozone is perfectly exhausted from the reaction chamber 71.

According to this embodiment, after the step S31, the inside of the reaction chamber 71 is vacuumed, thereby reducing the time required to perfectly exhaust the ozone. Also, as the result of the characteristic evaluation on the sample produced in accordance with this embodiment, the same result as in the first embodiment is obtained. In this way, according to this embodiment, the effect similar to the first embodiment is obtained, and the additional effect of the reduction in the time necessary for the pre-process is obtained.

[Third Embodiment]

Figure 13:
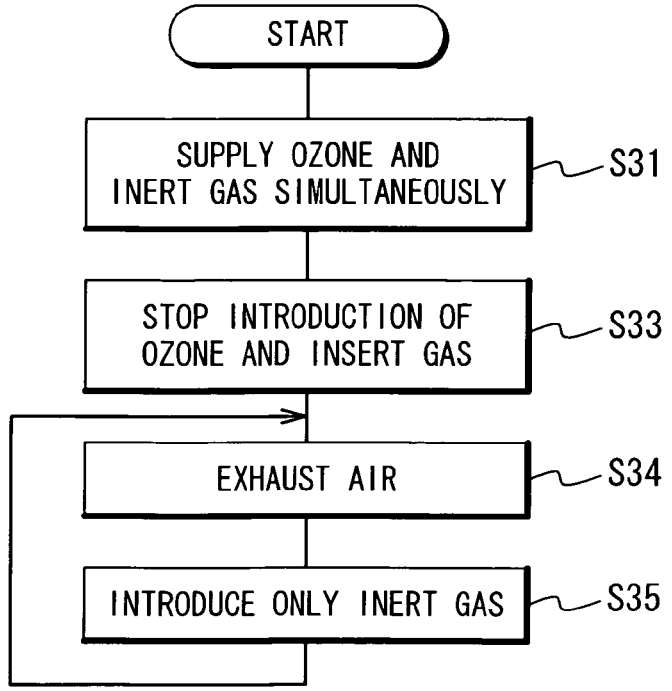
FIG. 13 is a flowchart showing a method of forming a dielectric film according to a third embodiment.

FIG. 13 is a flowchart showing an ozone pre-process (Step S30) according to the third embodiment of the present invention. According to this embodiment, the foregoing step S34 and step S35 are repeatedly executed. Thus, the time required to perfectly exhaust the ozone is further reduced. According to this embodiment, the effect similar to the first embodiment is obtained, and the additional effect of the reduction in the time necessary for the pre-process is obtained.

According to the present invention, the leakage current characteristic of the capacitor is improved, and the lifetime of the capacitive insulating film is elongated. Thus, the data holding characteristic and reliability of the DRAM are improved. Also, according to the present invention, the capacitance reduction in the capacitor is suppressed to the minimum. In this way, both of the reduction in the leakage current and the keeping of the capacitor capacitance are attained. Moreover, the special facility to form the capacitive insulating film having the good quality is not required to be provided. Therefore, the manufacture cost is decreased.

Moreover, according to the above-mentioned embodiments, the pre-process uses the argon as the inert gas. The reasons are as follows. That is, (1) at the ALD step (Step S40), the argon is often used as the inert gas, (2) the argon is relatively cheap, and (3) since the atom of the argon is larger and heavier than the nitrogen atom, it is suitable for the replacement in the pipe and reaction chamber. However, in case of the facility that uses nitrogen ($N_2$) and xenon (Xe) instead of the argon at the ALD step, even the pre-process may use the nitrogen and the xenon as the inert gas. Even in that case, the similar effect is obtained. In case of the nitrogen, the replacement in the pipe and reaction chamber is inferior to the case of the argon. On the contrary, since the nitrogen is very cheap, it is superior in cost. In case of the xenon, its atom is large and heavy as compared with the foregoing two kinds of gases. Thus, the replacement in the pipe and reaction chamber is best. On the other hand, since the xenon is expensive, it is inferior in cost. Anyway, the fact that the same inert gas is used in the pre-process step and the ALD step has the merit that the facility is simplified and the cost is reduced.

Also, according to the above-mentioned embodiments, the ALD step uses the ozone as the oxidizer. However, instead of the ozone, water ($H_2O$) may be used as the oxidizer. However, from the viewpoint of the simplification of the facility, the process for using the ozone as the oxidizer is preferable.

Also, in the above-mentioned embodiments, the amorous aluminum oxide film is exemplified as the capacitive insulating film 40. However, the capacitive insulating film 40 is not limited thereto, and an amorous hafnium oxide film or amorous zirconium oxide film may be used. Also, the capacitive insulating film 40 may be the multiple-layer lamination film in which the films of the two kinds or more among the three kinds are alternately laminated.

Also, in the above-mentioned embodiments, the capacitor 60 has the cylinder type structure and the hemi spherical type grain silicon structure. However, the structure of the capacitor 60 is not limited thereto. The capacitor 60 may have only the mere cylinder type structure. Also, the capacitor 60 may have a stack structure or a crown structure instead of the cylinder structure. Even in that case, the similar effect is obtained.

Also, the present invention is useful even for the manufacturing of the MOS transistor in which the high dielectric film is used as the gate insulating film.

What is claimed is:

1. A method of manufacturing a capacitor, comprising:
    forming a lower electrode of a capacitor on or above a semiconductor substrate;
    introducing an ozone gas and an inert gas simultaneously for a predetermined period into a reaction chamber of an atomic layer deposition apparatus in which said semiconductor substrate is set;
    exhausting said ozone gas from said reaction chamber by stopping the introduction of said ozone gas and introducing only said inert gas into said reaction chamber, after said introducing said ozone gas and said inert gas:
    forming a capacitive dielectric film on said lower electrode by an atomic layer deposition (ALD) method in said atomic layer deposition apparatus, after said exhausting said ozone gas from said reaction chamber: and
    forming an upper electrode of said capacitor on said capacitive dielectric film after said capacitive dielectric film is formed,
    wherein said introducing the ozone gas and inert gas simultaneously is performed after said forming the lower electrode and prior to said forming the capacitive dielectric film on the lower electrode.

2. The method according to claim 1, wherein said exhausting said ozone gas from said reaction chamber comprises:
    stopping the introduction of said ozone gas and said inert gas;
    exhausting said reaction chamber to a lower pressure vacuum state after said stopping; and
    introducing only said inert gas into said reaction chamber, after said exhausting said reaction chamber to a vacuum state.

3. The method according to claim 2, wherein said exhausting the ozone gas from the reaction chamber comprises:
    repeating said exhausting said reaction chamber to a vacuum state and said introducing only said inert gas into said reaction chamber.

4. The method according to claim 1, wherein said predetermined period comprises a period in a range from 1 second to 120 seconds.

5. The method according to claim 1, wherein said predetermined period comprises a period in a range from 40 seconds to 120 seconds.

6. The method according to claim 1, wherein a process temperature in each of said introducing the ozone gas and the inert gas simultaneously and said exhausting the ozone gas from the reaction chamber, is substantially same as a process temperature in said forming the capacitive dielectric film on the lower electrode.

7. The method according to claim 1, further comprising:
    forming an oxidization preventing film on said lower electrode after said forming a lower electrode of a capacitor and before said introducing the ozone gas and the inert gas simultaneously for a predetermined period into the reaction chamber.

8. The method according to claim 1, wherein said forming the capacitive dielectric film comprises:
    introducing a material gas which contains a material of a capacitive insulating film into said reaction chamber;
    introducing the inert gas in said reaction chamber to purge said material gas; and
    introducing an oxidation gas necessary for oxidation reaction into said reaction chamber, and
    wherein said inert gas used to purge said material gas is the same as the inert gas simultaneously introduced with the ozone gas and the inert gas introduced into said reaction chamber alter exhausting and prior to forming the capacitive dielectric film on said lower electrode.

9. The method according to claim 8, wherein said oxidation gas used in said introducing said oxidation gas necessary for oxidation reaction into said reaction chamber comprises an ozone gas.

10. The method according to claim 8, wherein said capacitive dielectric film comprises at least one of an amorphous aluminum oxide film, an amorphous hafnium oxide film and an amorphous zirconium oxide film.

11. A method of forming a dielectric film, comprising:
    setting a semiconductor substrate on which a lower layer structure has been formed, in a reaction chamber of an atomic layer deposition apparatus;
    introducing an ozone gas and an inert gas simultaneously into said reaction chamber for a predetermined period;

exhausting said ozone gas from said reaction chamber by stopping the introduction of said ozone gas and introducing only said inert gas into said reaction chamber; and forming a dielectric film on said lower layer structure by an atomic layer deposition (ALD) method in said atomic layer deposition apparatus.

12. A method of manufacturing a semiconductor device, comprising:
   forming a dielectric film over a semiconductor substrate by use of an atomic layer deposition method, wherein the atomic layer deposition method comprises:
      supplying a metal source gas to the semiconductor substrate;
      supplying an oxygen source gas to the semiconductor substrate in place of the metal source gas; and
      repeating said supplying a metal source gas and said supplying an oxygen source gas at least one time to thereby form the dielectric film; and
   performing a preprocessing operation over the semiconductor substrate prior to forming the dielectric film by use of the atomic layer deposition method, wherein performing a preprocessing operation comprises:
   supplying an oxygen source gas and an inert gas to the semiconductor substrate;
   stopping supplying the oxygen source gas; and
   exhausting the oxygen source gas.

13. The method according to claim 12, wherein the oxygen source gas employed in the atomic layer deposition method and the oxygen source gas employed in the preprocessing operation comprise an ozone gas.

14. The method according to claim 13, further comprising:
   after exhausting the oxygen source gas, supplying inert gas to the semiconductor substrate.

15. The method according to claim 12, wherein during the preprocessing operation the semiconductor substrate is heated to a temperature between 250° C. to 500° C.

16. The method according to claim 14, wherein the exhausting of the oxygen source gas and the supplying of the inert gas to the semiconductor substrate is repeated a plurality of times.

17. The method according to claim 12, further comprising placing the semiconductor substrate in a reaction chamber, a pressure inside the reaction chamber ranging from 0.133 Pa and 13.3 Pa.

18. The method according to claim 12, wherein the preprocessing operation includes applying vacuum during said exhausting the oxygen source gas.

19. The method according to claim 12, wherein the oxygen source gas is supplied to the semiconductor substrate through a delivery system, the delivery system also being utilized to supply the metal source gas.

* * * * *